United States Patent
Uya (10) Patent No.: US 7,898,051 B2
(45) Date of Patent: Mar. 1, 2011

(54) IMAGING DEVICE, METHOD OF DRIVING IMAGING DEVICE, AND METHOD OF MANUFACTURING IMAGING DEVICE

(75) Inventor: Shinji Uya, Miyagi (JP)

(73) Assignee: FUJIFILM Corporation, Tokyo (JP)

( * ) Notice: Subject to any disclaimer, the term of this patent is extended or adjusted under 35 U.S.C. 154(b) by 413 days.

(21) Appl. No.: 12/114,397

(22) Filed: May 2, 2008

(65) Prior Publication Data

US 2008/0303112 A1 Dec. 11, 2008

(30) Foreign Application Priority Data

May 7, 2007 (JP) .................. P2007-122509

(51) Int. Cl.
*H01L 27/146* (2006.01)
*H01L 21/00* (2006.01)

(52) U.S. Cl. .............. 257/438; 257/184; 257/186; 257/447; 257/460; 257/E31.063; 257/E31.116; 438/57; 438/91; 438/380; 348/294

(58) Field of Classification Search ............ 257/184, 257/186, 431, 438, 447, 460, 428, E31.054, 257/E31.053, E31.052, E31.063, E31.116; 438/57, 91, 380; 348/294
See application file for complete search history.

(56) References Cited

U.S. PATENT DOCUMENTS 5,481,124 A * 1/1996 Kozuka et al. .............. 257/185

2006/0197007 A1 * 9/2006 Iwabuchi et al. .......... 250/208.1

FOREIGN PATENT DOCUMENTS

| JP | 4-115575 A | 4/1992 |
|---|---|---|
| JP | 6-243795 A | 9/1994 |
| JP | 7-66379 A | 3/1995 |
| JP | 7-176721 A | 7/1995 |

* cited by examiner

*Primary Examiner*—A. Sefer
*Assistant Examiner*—Ermias Woldegeorgis
(74) *Attorney, Agent, or Firm*—Birch, Stewart, Kolasch & Birch, LLP (57) ABSTRACT

An imaging device is provided and includes: a photoelectric conversion layer that has a silicon crystal structure and generates signal charges upon incidence of light; a multiplication and accumulation layer that multiplies the signal charges by a phenomenon of avalanche electron multiplication; and a wiring substrate that reads the signal charges from the multiplication and accumulation layer and transmits the read signal charges. The photoelectric conversion layer includes: a first conductive impurity layer containing first impurities in an impurity concentration; an electron acceleration layer containing the first impurities in a lower impurity concentration than the first conductive impurity layer; and a second conductive impurity layer to which a voltage is applied, the second conductive impurity layer containing second impurities and disposed on a side opposite a light incidence side of the electron acceleration layer, and an insulating layer is disposed between the electron acceleration layer and the multiplication and accumulation layer.

6 Claims, 10 Drawing Sheets

IMAGING DEVICE, METHOD OF DRIVING IMAGING DEVICE, AND METHOD OF MANUFACTURING IMAGING DEVICE

This application is based on and claims priority under 35 U.S.C. §119 from Japanese Patent Application No. 2007-122509 filed May 7, 2007, the entire disclosure of which is herein incorporated by reference.

BACKGROUND OF THE INVENTION

1. Field of the Invention

The present invention relates to an imaging device that uses a phenomenon of avalanche electron multiplication, a method of driving an imaging device, and a method of manufacturing an imaging device.

2. Description of Related Art

Imaging devices that use a phenomenon of avalanche electron multiplication have been proposed in the related art. For example, as disclosed in JP-A-4-115575, there is a technique of causing electron multiplication by generating a high electric field from a photodiode to a read gate. In addition, as shown in JP-A-4-176721, there is a configuration in which a high electric field is applied in the middle of a transfer path.

In addition, as shown in JP-A-7-66379, there is a configuration in which a stacked layer of a stacking type image sensor is used as an electron multiplication layer. Moreover, a technique of performing electron acceleration or electron multiplication outside an image sensor has also been proposed. An image sensor in which an image intensifier and a CCD are combined or an image sensor, in which a backside illuminated type CCD is provided in an electron tube having a photoelectric surface disclosed in JP-A-6-243795 and electrons accelerated at high speed are injected into a silicon layer of the CCD, has been put to practical use as an image sensor for professional special imaging.

However, in those disclosed in JP-A-4-115575 and JP-A-7-176721, an image magnification ratio of electrons is several percent to several tens of percent and an extremely high voltage is required to increase the image magnification ratio in a read gate. As a result, it becomes difficult to secure the reliability, and deviation in a multiplication factor for every pixel occurs and a signal amplified due to machining deviation of the read gate is generated. Furthermore, in order to realize a high multiplication factor in multiplication in a transfer path, it is necessary to apply a high voltage difference between adjacent electrodes, which causes a problem in the reliability. However, in order to drop a voltage, it is necessary to perform multiplication driving in many transfer stages. Accordingly, a study on the configuration, such as providing an additional transfer portion or providing a ring-shaped transfer portion, was required. For this reason, in any configuration disclosed in the documents above, it was necessary to increase the chip area in order to secure the reliability and a high multiplication factor.

In the case of the configuration disclosed in JP-A-7-66379, the stacked layer cannot necessarily be formed on an ideally flat substrate, such as an electron tube. Accordingly, it is very difficult to form the stacked layer uniform and it is not put to practical use.

In the case of the configuration disclosed in JP-A-6-243795 in which a backside illuminated type CCD is provided in an electron tube formed with a photoelectric surface, an increase in volume cannot be avoided. In particular, it was difficult to provide the structure in imaging apparatuses for consumer use, such as a digital camera and a video camera.

SUMMARY OF THE INVENTION

An object of an illustrative, non-limiting embodiment of the invention is to provide an imaging device that can be applied to an imaging apparatus for consumer use and is highly reliable, a method of driving an imaging device, and a method of manufacturing an imaging device.

The above object of the invention can be achieved by the following configurations.

(1) An imaging device including: in order,
a photoelectric conversion layer that has a silicon crystal structure and generates signal charges upon incidence of light;
a multiplication and accumulation layer that multiplies the signal charges by a phenomenon of avalanche electron multiplication; and
a wiring substrate that reads the signal charges from the multiplication and accumulation layer and transmits the read signal charges,
wherein
the photoelectric conversion layer includes:
a first conductive impurity layer containing first impurities in an impurity concentration;
an electron acceleration layer containing the first impurities in a lower impurity concentration than that of the first conductive impurity layer; and
a second conductive impurity layer to which a voltage is applied, the second conductive impurity layer containing second impurities and disposed on a side opposite a light incidence side of the electron acceleration layer, and
an insulating layer is disposed between the electron acceleration layer and the multiplication and accumulation layer.

(2) The imaging device according to (1), wherein the impurity concentration of the first layer gradually decreases in a direction of incident light.

(3) The imaging device according to (1) or (2), wherein the photoelectric conversion layer includes: a low electric field region disposed at a light incidence side of the photoelectric conversion layer; and a high electric field region closer to a side of the multiplication and accumulation layer than the low electric field region, the high electric field region having an electric potential gradient larger than that of the low electric field region.

(4) The imaging device according to any one of (1) to (3), wherein the photoelectric conversion layer has a thickness of 5 μm or more.

(5) A method of manufacturing an imaging device according to any one of (1) to (4), wherein the photoelectric conversion layer and the multiplication and accumulation layer has a structure in which epitaxial layers, each including a plurality of impurity layers formed by epitaxial growth, are superposed each other, the method including:
sequentially forming impurity layers on a first silicon substrate by epitaxial growth as a first epitaxial layer;
forming an oxide layer on a surface of the first epitaxial layer;
injecting hydrogen ions between the first silicon substrate and an impurity layer adjacent to the first silicon substrate;
bonding the first epitaxial layer via oxide layer to a second epitaxial layer formed on a second silicon substrte; and
separating the first epitaxial layer from the first silicon substrate by using a smart cutting method.

(6) A method of driving an imaging device according to any one of (1) to (4), including applying a negative voltage to the first impurity layer in high-sensitivity imaging, wherein an absolute value of the negative voltage is larger that that in normal imaging.

BRIEF DESCRIPTION OF THE DRAWINGS

The features of the invention will appear more fully upon consideration of the exemplary embodiments of the inventions, which are schematically set forth in the drawings, in which:

FIGS. 8A and 9B are views explaining procedures in a method of manufacturing an imaging device;

1: photoelectric conversion layer
2: multiplication and accumulation layer
3: wiring substrate
10, 20, 30, 40: imaging device
11, 21: insulating layer (silicon oxide layer)

DETAILED DESCRIPTION OF THE EXEMPLARY EMBODIMENTS

An imaging device according to an exemplary embodiment of the invention is configured such that an electric field is generated in the electron acceleration layer by applying a voltage to the high-concentration impurity layer formed in the photoelectric conversion layer having a silicon crystal structure and electrons, which are generated by incident light photoelectrically converted, are accelerated in the electron acceleration layer, pass through an oxide layer, and moves to the multiplication and accumulation layer. Since a phenomenon of avalanche multiplication occurs in the multiplication and accumulation layer due to the accelerated electrons, the receiving sensitivity can be improved. In the case of applying a high electric field in a backside illuminated type image sensor in the related art, when a negative bias is applied to a high-concentration p layer immediately below a rear-surface oxide layer, holes are sucked out from a p layer of an element region on a surface to thereby cause depletion. As a result, an operation of an element on the surface becomes abnormal. In the case of a technique of applying a high voltage to an element side on the surface, it was difficult to realize a fine pixel since it is necessary to increase a read voltage in order to increase a depletion potential of an n layer of a surface region.

On the other hand, in an imaging device according to an exemplary embodiment of the invention, the insulating layer is formed between the electron acceleration layer and the multiplication and accumulation layer. Accordingly, since electrons are accelerated to pass through the oxide layer, it is possible to stabilize an operation of an element on a light-incidence-side surface of the photoelectric conversion layer. In addition, the electron acceleration layer has the same structure as a discrete power transistor and can sufficiently apply a high voltage required for a high multiplication factor. Since the photoelectric conversion layer can be formed on a flat substrate serving as a base and has a silicon crystal structure that is a homogeneous material, an ideal semiconductor can be formed. In addition, a high electron multiplication factor can be realized regardless of an applied voltage and without lowering the reliability. Since the imaging device having such a configuration can be made small by a semiconductor manufacturing process using SOI (silicon on insulator) and a smart cutting method, the imaging device can be used in imaging apparatuses for consumer use, such as a digital camera and a digital video camera.

Furthermore, an imaging device according to an exemplary embodiment of the invention is preferably configured to have a low electric field region, which is provided at the light incidence side, and a high electric field region, which is formed to be closer to a side of the multiplication and accumulation layer than the low electric field region is and has an electric potential gradient larger than the low electric field region. Accordingly, the thickness of a photoelectric conversion layer in the low electric field region can be set such that most visible light can be completely absorbed and electron multiplication can be performed in the high electric field region. As a result, since it can be prevented that electron multiplication depending on the wavelength of incident light occurs, it is possible to make uniform an electron multiplication factor changing with a wavelength. In this manner, it is possible to cope with a characteristic that a light absorption rate of silicon crystal greatly changes in a range of visible light, for example, red light is transmitted deep into the silicon crystal and most blue light is absorbed within 1 82 m from a surface. It was not possible to realize this structure in a known silicon wafer technique. However, since the SOI (silicon on insulator) structure can be cheaply and stably supplied by the smart cutting method, it becomes possible to form the structure by using a wafer including two embedded oxide layers of SOI like the structure of the imaging device according to an exemplary embodiment of the invention. In addition, an impurity structure that forms the imaging device can be manufactured by epitaxial growth.

According to an exemplary embodiment of the invention, it is possible to provide an imaging device that can be applied to an imaging apparatus for consumer use and is highly reliable, a method of driving an imaging device, and a method of manufacturing an imaging device.

Hereinafter, exemplary embodiments of the invention will be described in detail with reference to the accompanying drawings.

Figure 1:
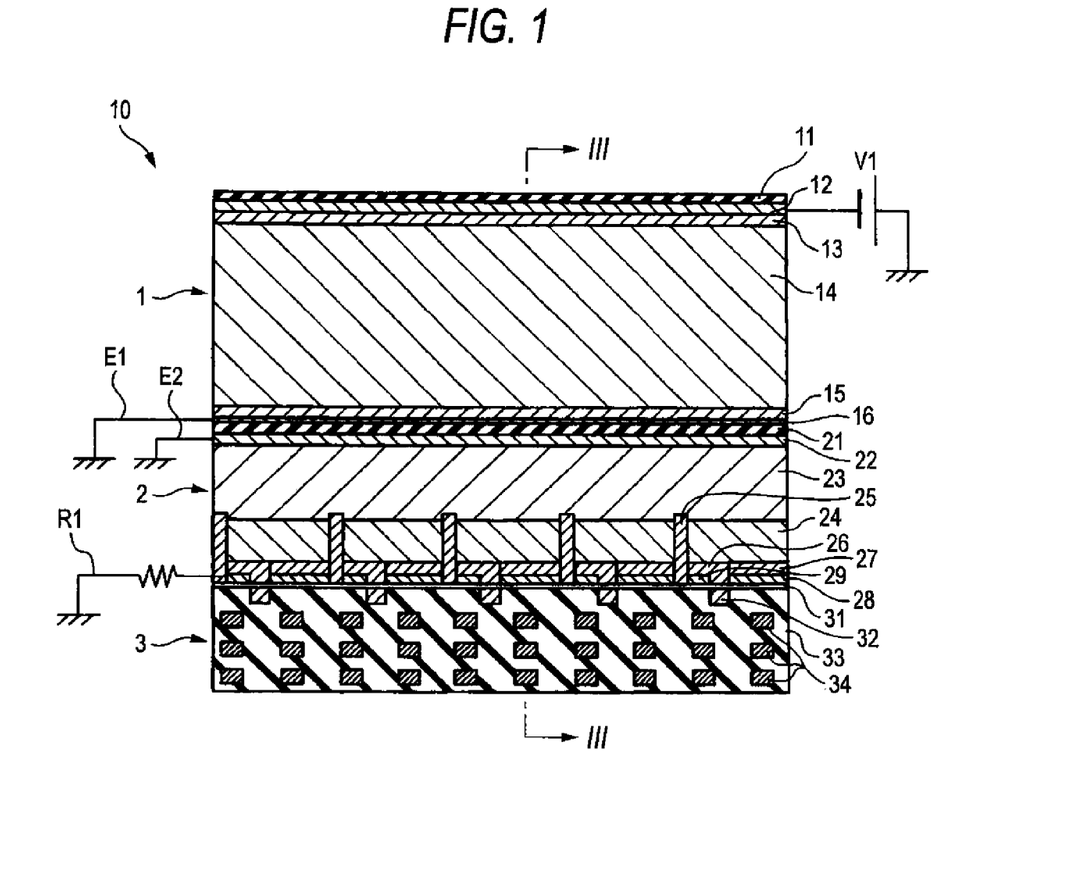
FIG. 1 is a cross-sectional view illustrating an imaging device according to a first exemplary embodiment of the invention.

FIG. 1 is a cross-sectional view illustrating an imaging device according to a first exemplary embodiment of the invention. An imaging device 10 is of a backside illuminated type. That is, light is incident from a backside of a semiconductor substrate, signal charges generated inside the semiconductor substrate due to the incident light are accumulated in a charge storage region formed on a front side of the semiconductor substrate, and signal charges corresponding to electric charges stored in the charge storage region are output to the outside by a CCD or CMOS circuit, such that an imaging operation is performed. Moreover, in the present embodiment, a configuration that uses a CMOS circuit is adopted.

The imaging device 10 includes: a photoelectric conversion layer 1 that has a silicon crystal structure and generates signal charges upon incidence of light; a multiplication and accumulation layer 2 that is stacked on the photoelectric conversion layer 1 and multiplies the signal charges generated in the photoelectric conversion layer 1 by a phenomenon of avalanche electron multiplication; and a wiring substrate 3 that is stacked on the multiplication and accumulation layer 2 and reads the signal charges from the multiplication and accumulation layer 2 and transmits the read signal charges. The imaging device 10 has a configuration in which the photoelectric conversion layer 1, the multiplication and accumulation layer 2, and the wiring substrate 3 are stacked sequentially from an upper part in the vertical direction in FIG. 1. At the time of imaging, light from the outside is incident from an upper surface (upper side surface in FIG. 1) of the photoelectric conversion layer 1 and is then illuminated to the inside of the photoelectric conversion layer 1.

The photoelectric conversion layer 1 includes a silicon oxide layer ($SiO_2$) 11, a high-concentration p-type impurity layer 12, a p-type impurity layer 13 having a lower impurity concentration than that of the high-concentration p-type impurity layer 12, a $p^-$-type impurity layer 14 having a lower impurity concentration than that of the p-type impurity layer 13, an n-type impurity layer 15, and an $n^+$-type impurity layer 16 having a higher impurity concentration than that the n-type impurity layer 15, which are provided sequentially from a light incidence side.

In the photoelectric conversion layer 1, the high-concentration p-type impurity layer 12, the p-type impurity layer 13, and the $p^-$-type impurity layer 14 constitute an impurity layer formed such that the impurity concentration decreases from a light incidence surface toward a side of the multiplication and accumulation layer 2 that is a layer provided below the photoelectric conversion layer 1. When light is incident on the photoelectric conversion layer 1, signal charges corresponding to the amount of incident light are generated by photoelectric conversion. The photoelectric conversion layer 1 is formed to have a thickness of 5 μm to 10 μm or more so that visible light can be sufficiently absorbed.

A voltage applying unit V1 is connected to the high-concentration p-type impurity layer 12 so that a voltage can be applied thereto. In the present embodiment, a negative voltage of −20 V to −50 V is applied. In addition, a ground circuit E1 is connected to the $n^+$-type impurity layer 16 so that the $n^+$-type impurity layer 16 is set to 0 V. In the present embodiment, the high-concentration p-type impurity layer 12 and the p-type impurity layer 13 function as the first conductive impurity layer containing first impurities (p-type), the $p^-$-type impurity layer 14 having the lower impurity concentration functions as an electron acceleration layer, and the $n^+$-type impurity layer 16 functions as the second conductive impurity layer containing second impurities (n-type).

When driving an imaging device, a negative voltage whose absolute value is larger than that at the time of normal imaging is applied at the time of high-sensitivity imaging.

Since the photoelectric conversion layer 1 has a impurity concentration distribution in the direction in which incident light is transmitted, an electric potential gradient is formed by the voltage applying unit V1 and an electric field intensity is generated. For this reason, the $p^-$-type impurity layer 14 having a relatively low impurity concentration functions as an electron acceleration layer due to a voltage applied by the voltage applying unit V1, and as a result, electrons generated upon incidence of light is accelerated.

The multiplication and accumulation layer 2 includes a silicon oxide layer ($SiO_2$) 21, a high-concentration p-type impurity layer 22, and a $p^-$-type impurity layer 23 having lower impurity concentration than that of the p-type impurity layer 22 formed sequentially from a side of the photoelectric conversion layer 1. In addition, a plurality of $n^-$-type impurity regions 24, which are separated for every pixel by element separation regions 25, are formed below the $p^-$-type impurity layer 23 in a line in the horizontal direction (left and right directions in FIG. 1). In addition, a ground circuit E2 is connected to the p-type impurity layer 22 so that the p-type impurity layer 22 is set to 0 V.

A region where an n-type impurity region 27 and a high-concentration $p^+$-type impurity region 28, which have a higher impurity concentration than that of the $n^-$-type impurity region 24, are stacked and a p-type impurity region 26 having a lower impurity concentration than that of the $p^+$-type impurity region 28 are formed below each of the $n_-$-type impurity regions 24 in a line in the horizontal direction. A high-concentration n-type impurity region 29, which is adjacent to the element separation region 25 and is provided so as to be separated from the impurity region 27 and the impurity region 28 with the impurity region 26 interposed therebetween, is provided in a lower portion of the p-type impurity region 26. A resistor circuit R1 having predetermined resistance is connected to the element separation region 25.

An insulating layer 33 is formed on bottom surfaces of the impurity regions 26, 29, and 28 with a gate insulating layer 31 interposed therebetween. An electric charge read region 32 formed of polysilicon, for example, is provided at an interface between the insulating layer 33 and the gate insulating layer 31 and at the lower position of the impurity region 26 provided between the impurity region 29 and the impurity region 28.

The multiplication and accumulation layer 2 is stacked on the photoelectric conversion layer 1 with the silicon oxide layer 21 interposed therebetween. Accordingly, it can be prevented that when electrons are accelerated to pass through an oxide layer in the photoelectric conversion layer 1, holes are sucked out from a p layer of an element region on a surface due to application of a high electric field to thereby cause depletion, and as a result, an operation of an element on the surface becomes abnormal like a known rear surface irradiation type image sensor. Thus, it is possible to stabilize an operation of an element on a light-incidence-side surface of the photoelectric conversion layer.

Figure 2:
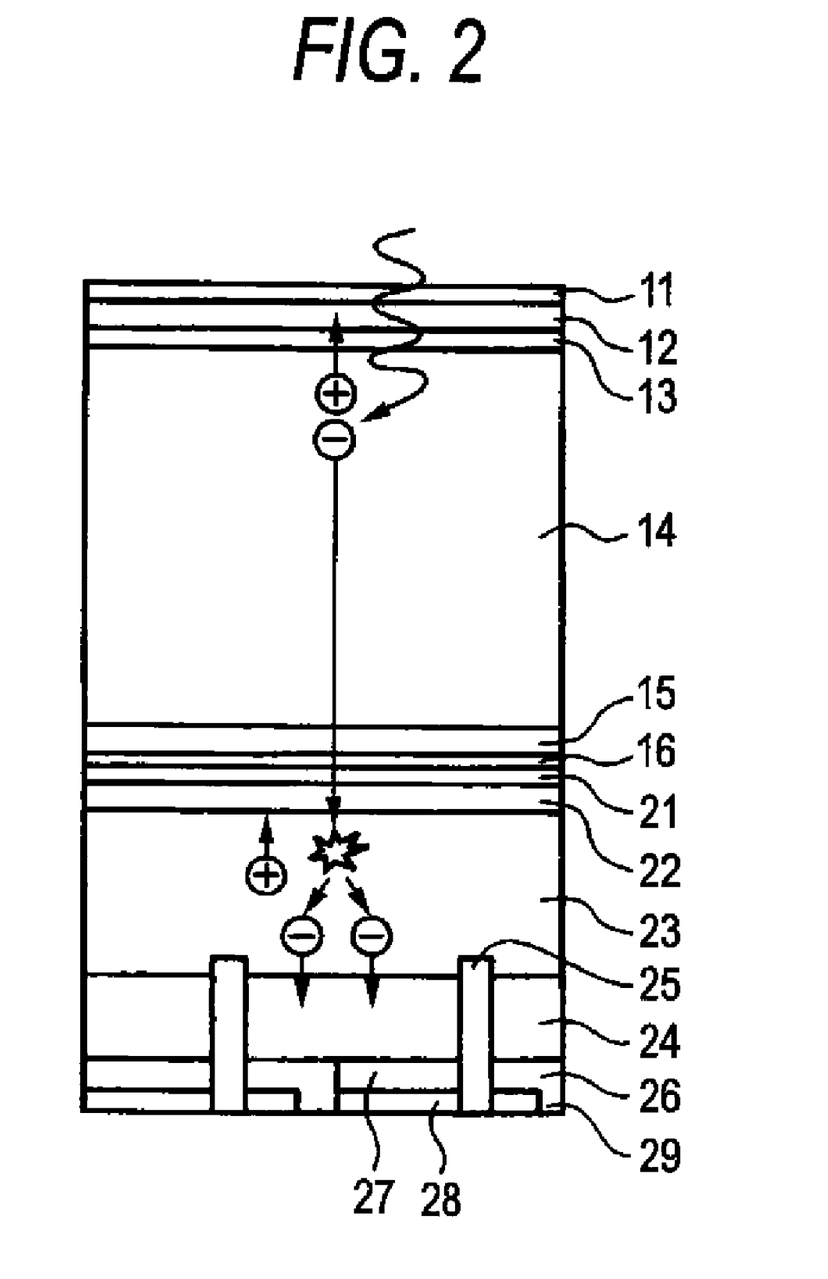
FIG. 2 is a view explaining a state of electron transfer when light is incident on an imaging device at the time of imaging.
Figure 3:
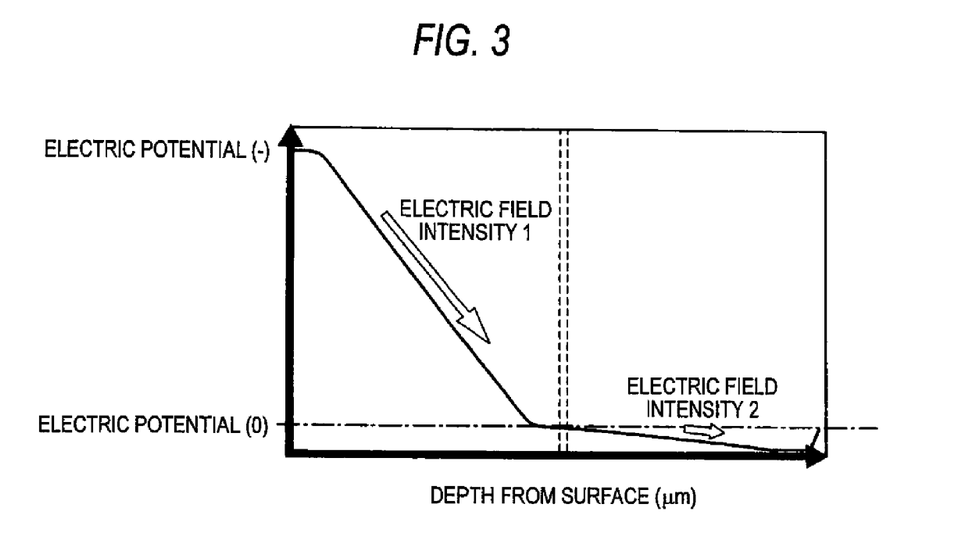
FIG. 3 is a graph illustrating an electric potential gradient on a section taken along the line III-III of FIG. 1.

FIG. 2 is a view explaining a state of electron movement when light is incident on an imaging device at the time of imaging. FIG. 3 is a graph illustrating an electric potential gradient on a section taken along the line III-III of FIG. 1.

At the time of imaging, as shown in FIG. 3, an electric potential gradient occurs in the photoelectric conversion layer 1 by applying a negative voltage to the high-concentration p-type impurity layer 12 and an electric field occurs. Then, electric charges photoelectrically converted in the photoelectric conversion part 1 move toward a side of the multiplication and accumulation layer 2 while being accelerated. Electrons accelerated in the photoelectric conversion layer 1 pass through the silicon oxide layer 21 and are then impact-ionized in silicon crystal inside the p-type impurity layer 22 and $p^-$-type impurity layer 23 of the multiplication and accumulation layer 2, and as a result, avalanche multiplication occurs. The multiplied electrons pass through the impurity region 24 to be then accumulated in the impurity regions 27 and 28. Then, the accumulated electrons are read to the impurity region 29 when a read pulse is applied to the electric charge read region 32. In addition, the silicon oxide layer 21 is not particularly limited, but other insulating layers may also be used as long as the other insulating layers allow accelerated electric charges to pass therethrough. Here, an electric field intensity 1 of the photoelectric conversion layer 1 can be controlled by changing a value of the negative voltage applied to the high-concentration p-type impurity layer 12.

A multi-layered wiring layer 34 formed of a conductive material, such as aluminum, is formed in the insulating layer 33.

In the imaging device 10 according to the present embodiment, it is possible to make accelerated electrons pass through the silicon oxide layer 21 by forming the silicon oxide layer 21 between the multiplication and accumulation layer 2 and the electron acceleration layer formed in the photoelectric conversion layer 1. As a result, an operation of an element on a light-incidence-side surface of the photoelectric conversion layer 1 can be stabilized. In addition, the electron acceleration layer has the same structure as a discrete power transistor and can sufficiently apply a high voltage required for a high multiplication factor. Since the photoelectric conversion layer 1 can be formed on a flat substrate serving as a base and has a silicon crystal structure that is a homogeneous material, an ideal semiconductor can be formed. In addition, a high electron multiplication factor can be realized regardless of an applied voltage and without lowering the reliability.

Furthermore, in the imaging device 10 having the above-described configuration, in the case when a negative voltage is applied to the high-concentration impurity layer 12, it is preferable to perform driving such that a negative voltage whose absolute value is larger than that at the time of normal imaging is applied at the time of high-sensitivity imaging. In this manner, the electron multiplication factor can be controlled depending on the purpose of imaging.

Figure 4:
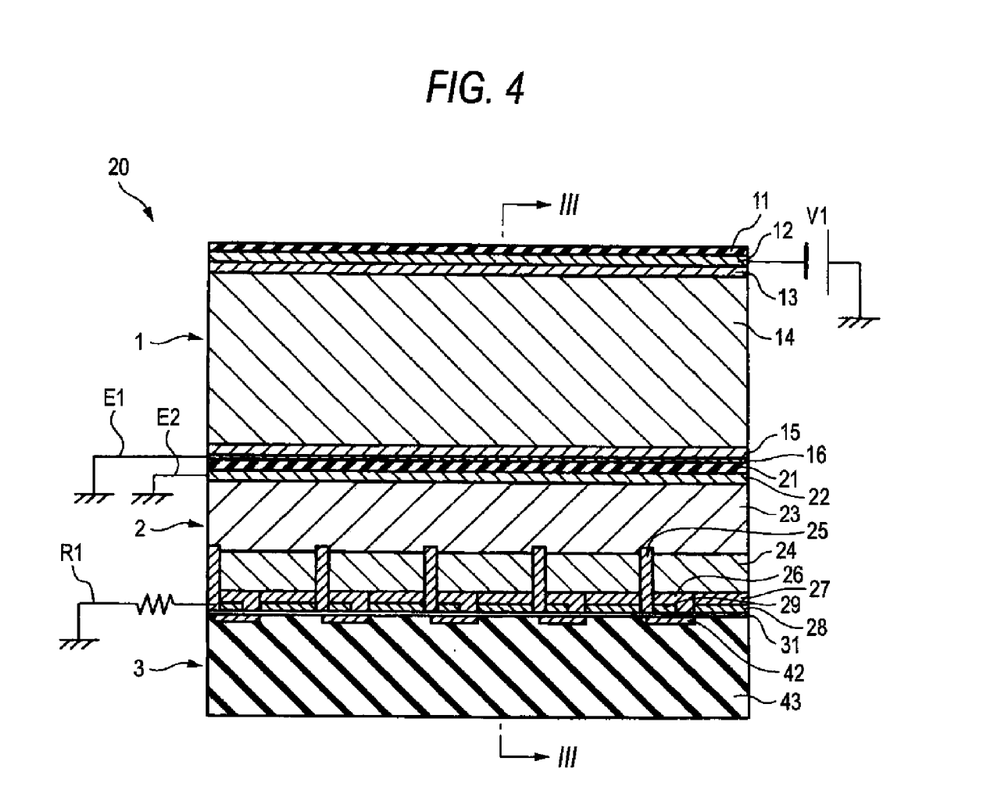
FIG. 4 is a cross-sectional view illustrating the configuration of an imaging device according to a second exemplary embodiment.

FIG. 4 is a cross-sectional view illustrating the configuration of an imaging device according to a second exemplary embodiment of the invention. Moreover, in the embodiments to be described below, a member having the same configuration and operation as the member already described is denoted by the same reference numeral or equivalent numeral, and an explanation thereof is simplified or omitted. An imaging device 20 according to the present embodiment basically has the same configuration as the imaging device 10 according to the first embodiment except that the configuration of a wiring substrate 3 is different from that of the imaging device 10 according to the first embodiment. Hereinafter, only the different configuration will be described.

As shown in FIG. 4, the imaging device 20 has the same wiring structure as a circuit of a CCD image sensor.

Specifically, a region where an n-type impurity region 27 and a high-concentration $p^+$-type impurity region 28, which have a higher impurity concentration than that of an $n^-$-type impurity region 24, are stacked and a p-type impurity region 26 having a lower impurity concentration than that of the $p^+$-type impurity region 28 are formed below each of the $n^-$-type impurity regions 24 in a line in the horizontal direction. A vertical charge transfer portion (VCCD) 39, which is adjacent to an element separation region 25 and is provided so as to be separated from the impurity region 27 and the impurity region 28 with the impurity region 26 interposed therebetween, is provided in a lower portion of the p-type impurity region 26. A resistor circuit R1 having a resistance is connected to the element separation region 25. In the present embodiment, electric charges accumulated in the n-type impurity region 27 are read to the vertical charge transfer portion 39 by an electric charge read region 42.

The wiring substrate 3 includes an insulating layer 43 and the electric charge read region 42 that is positioned at an interface between the insulating layer 43 and a gate insulating layer 31 and is formed of a conductive material, such as polysilicon, so as to cover bottom surfaces of the element separation region 25, the vertical charge transfer portion 39, and the impurity region 26 provided between the vertical charge transfer portion 39 and the impurity region 28.

Even when the wiring substrate 3 is configured to have CCD type wiring like the imaging device 20 according to the present embodiment, a high electron multiplication factor can be realized without lowering the reliability by the same operations and effects as in the first embodiment.

Figure 5:
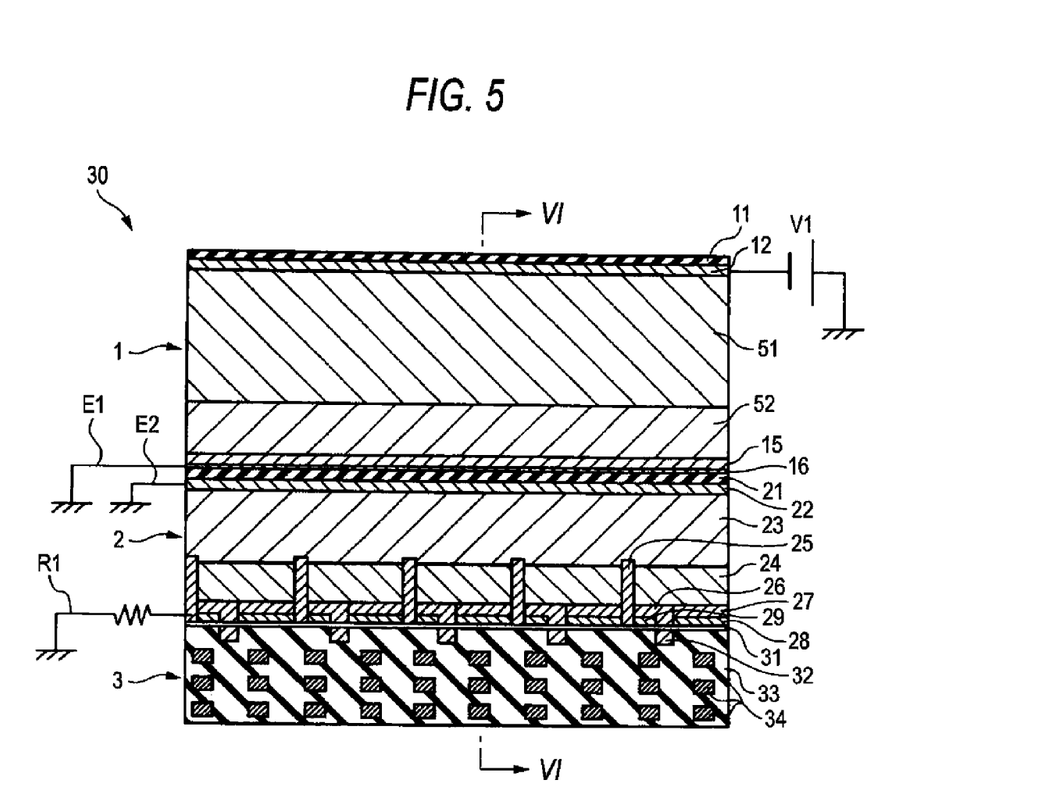
FIG. 5 is a cross-sectional view illustrating the configuration of an imaging device according to a third exemplary embodiment.

FIG. 5 is a cross-sectional view illustrating the configuration of an imaging device according to a third exemplary embodiment of the invention. An imaging device 30 according to the present embodiment basically has the same configuration as the imaging device 10 according to the first embodiment fundamentally except for the configuration of a photoelectric conversion layer 1. Hereinafter, only the different configuration will be described.

As shown in FIG. 5, the photoelectric conversion layer 1 of the imaging device 30 includes a silicon oxide layer ($SiO_2$) 11, a high-concentration p-type impurity layer 12, a p-type impurity layer 51 having a lower impurity concentration than that of the high-concentration p-type impurity layer 12, a $p^-$-type impurity layer 52 having a lower impurity concentration than that of the p-type impurity layer 51, an n-type impurity layer 15, and an $n^+$-type impurity layer 16 having a higher impurity concentration than that of the n-type impurity layer 15, which are provided sequentially from a light incidence side. Here, the p-type impurity layer 51 is configured such that the thickness thereof is larger than that of the p-type impurity layer 13 of the imaging device 10 according to the first embodiment. In the present embodiment, the thickness of the p-type impurity layer 51 is set to 8 to 12 μm.

Figure 6:
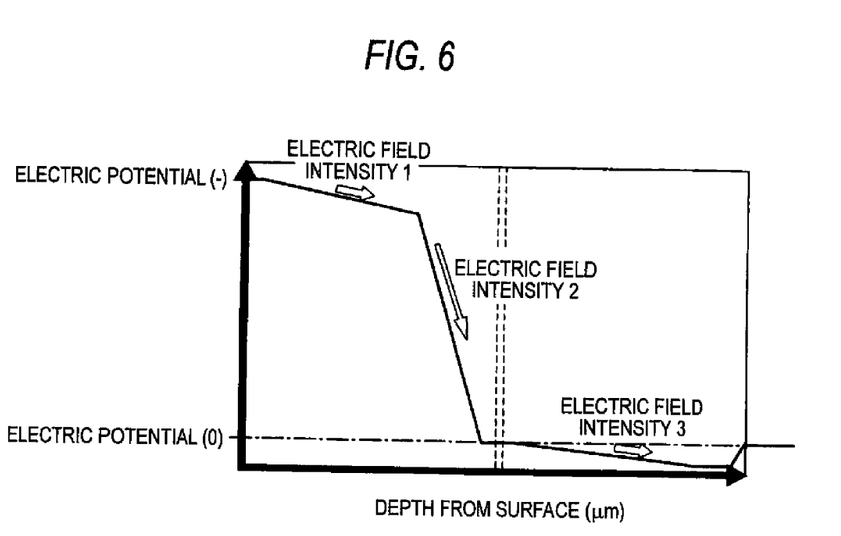
FIG. 6 is a graph illustrating an electric potential gradient on a section taken along the line VI-VI of FIG. 5.

FIG. 6 is a graph illustrating an electric potential gradient on a section taken along the line VI-VI of FIG. 5. As shown in FIG. 6, the p-type impurity layer 51 is configured to have a sufficient thickness so that most visible light can be absorbed. A region of an electric field intensity 1 of the p-type impurity layer 51 functions as a low electric field region. Since the electric field intensity in the region of the electric field intensity 1 is lower than that in a region of an electric field intensity 2 of the $p^-$-type impurity layer 52 provided below the p-type impurity layer 51, photoelectric conversion of incident light is expedited. The $p^-$-type impurity layer 52 functions as a high electric field region to accelerate electrons generated in the p-type impurity layer 51. Moreover, in a region of an electric field intensity 3 of a multiplication and accumulation layer 2, electrons are multiplied by impact ionization and are moved to an n-type impurity region 27 to be then accumulated. The electric charges accumulated in the n-type impurity region 27 are read to a scanning circuit of a CMOS through an electric charge read region 32.

An imaging device 30 is configured to have a low electric field region, which is provided at a light incidence side, and a high electric field region, which is formed to be closer to a side of the multiplication and accumulation layer 2 than the low electric field region is and has an electric potential gradient larger than the low electric field region. Accordingly, the thickness of a photoelectric conversion layer in the low electric field region can be set such that most visible light can be completely absorbed and electron multiplication can be performed in the high electric field region. As a result, since it can be prevented that electron multiplication depending on the wavelength of incident light occurs, it is possible to make uniform an electron multiplication factor changing with a wavelength. In this manner, it is possible to cope with a characteristic that a light absorption rate of silicon crystal greatly changes in a range of visible light, for example, red light is transmitted deep into the silicon crystal and most blue light is absorbed within 1 μm from a surface.

Figure 7:
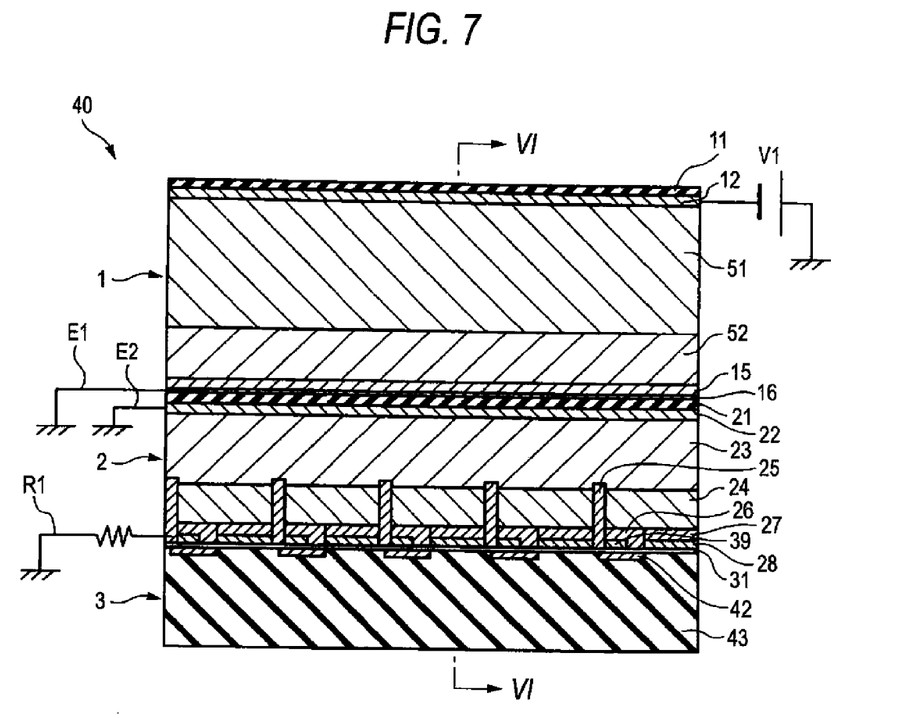
FIG. 7 is a cross-sectional view illustrating the configuration of an imaging device according to a fourth exemplary embodiment.

FIG. 7 is a cross-sectional view illustrating the configuration of an imaging device according to a fourth exemplary embodiment of the invention, Moreover, in the embodiment to be described below, a member having the same configuration and operation as the member already described is denoted by the same reference numeral or equivalent numeral, and an explanation thereof is simplified or omitted. An imaging device 40 according to the present embodiment basically has the same configuration as the imaging device 30 according to the third embodiment except that the configuration of a wiring substrate 3 is different from that of the imaging device 30 according to the third embodiment. Hereinafter, only the different configuration will be described.

As shown in FIG. 7, the imaging device 40 has the same wiring structure as a circuit of a CCD image sensor.

Specifically, a region where an n-type impurity region 27 and a high-concentration $p^+$-type impurity region 28, which have a higher impurity concentration than that an $n^-$-type impurity region 24, are stacked and a p-type impurity region 26 having a lower impurity concentration than that of the $p^+$-type impurity region 28 are formed below each of the $n^-$-type impurity regions 24 in a line in the horizontal direction. A vertical charge transfer portion (VCCD) 39, which is adjacent to an element separation region 25 and is provided so as to be separated from the impurity region 27 and the impurity region 28 with the impurity region 26 interposed therebetween, is provided in a lower portion of the p-type impurity region 26. A resistor circuit R1 having a resistance is connected to the element separation region 25.

The wiring substrate 3 includes an insulating layer 43 and an electric charge read region 42 that is positioned at an interface between the insulating layer 43 and a gate insulating layer 31 and is formed of a conductive material, such as polysilicon, over bottom surfaces of the element separation region 25, the vertical charge transfer portion 39, and the impurity region 26 provided between the vertical charge transfer portion 39 and the impurity region 28.

Next, a method of manufacturing the imaging device according to the embodiments will be described. FIGS. 8A and 8B, 9, 10A and 10B, and 11A and 11B are views explaining procedures in a method of manufacturing an imaging device. The imaging device according to the embodiments can be formed by using a semiconductor wafer that has two embedded oxide layers (equivalent to the silicon oxide layer in the above embodiments) formed by a SOI technique and an epitaxial technique. That is, the photoelectric conversion layer 1 and the multiplication and accumulation layer 2 in the embodiments described above have a structure in which epitaxial layers, which are obtained by depositing a plurality of impurity layers by epitaxial growth, are superposed each other, and a process of sequentially forming impurity layers on a silicon substrate by epitaxial growth, a process of forming an oxide layer on a surface of the impurity layer, a process of injecting hydrogen ions between the silicon substrate and the impurity layer, a process of bonding the epitaxial layers with the oxide layer, and separating the epitaxial layers from the silicon substrate by using a smart cutting method, are included. Hereinafter, an explanation will be described with reference to the drawings.

Figure 8A:
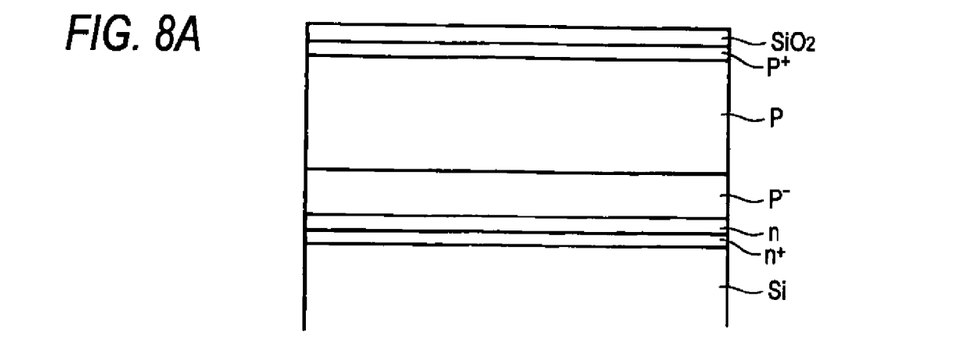

First, as shown in FIG. 8A, an $n^+$-type impurity layer, an n-type impurity layer, a $p^-$-type impurity layer, a p-type impurity layer, and a $p^+$-type impurity layer are sequentially formed on a silicon substrate by epitaxial growth, and a silicon oxide layer ($SiO_2$) is formed on a surface of the $p^+$-type impurity layer.

Figure 8B:
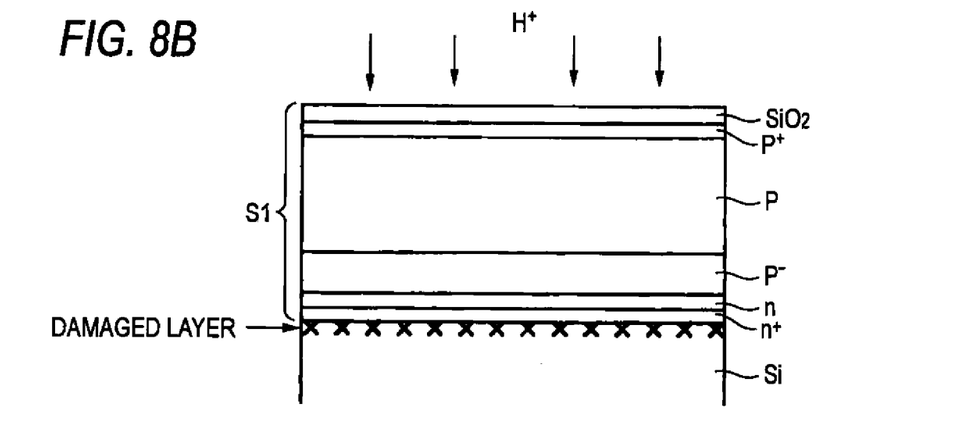

Then, as shown in FIG. 8B, a damaged layer is formed at the interface between the silicon substrate and the $n^+$-type impurity layer, which is located on the silicon substrate, by injecting a hydrogen ion ($H^+$) from a surface of the silicon oxide layer.

Figure 9:
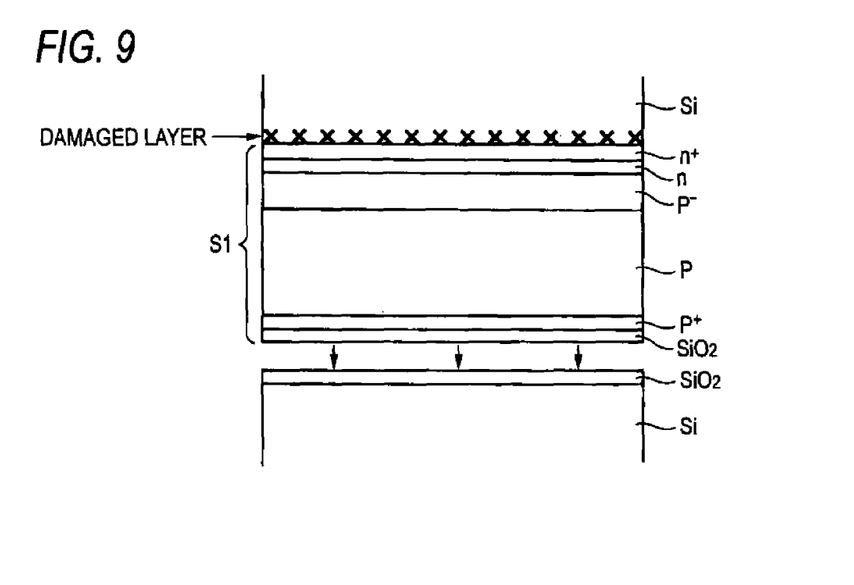
FIG. 9 is a view explaining procedures in the method of manufacturing an imaging device.

As shown in FIG. 9, a semiconductor substrate S1 is bonded to that obtained by forming a silicon oxide layer on a silicon substrate used as a wiring substrate of an imaging device. At this time, a wiring layer and an electric charge read region are formed beforehand in the silicon substrate used as a wiring substrate. Then, by using the damaged layer as a separation surface, the silicon substrate and the epitaxial layer of the semiconductor substrates S1 are separated by the smart cutting method.

Figure 10A:
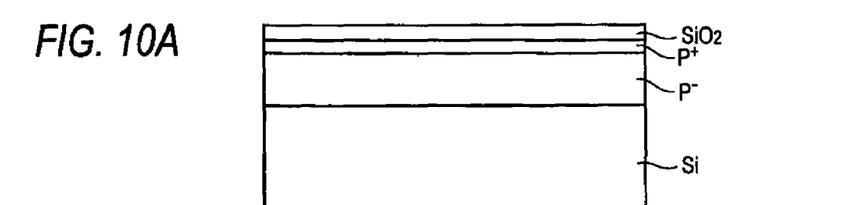
FIGS. 10A and 10B are views explaining procedures in the method of manufacturing an imaging device.

Then, as shown in FIG. 10A, a $p^-$-type impurity region and a $p^+$-type impurity region are sequentially formed on the silicon substrate by epitaxial growth, and a silicon oxide layer ($SiO_2$) is formed on a surface of the $p^+$-type impurity region.

Figure 10B:
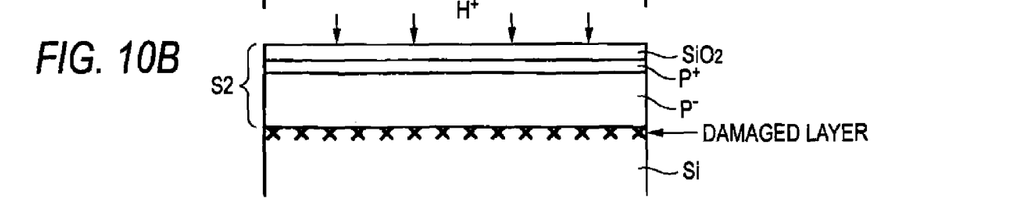

Then, as shown in FIG. 10B, a damaged layer is formed at the interface between the silicon substrate and the $p^-$-type impurity, which is located on the silicon substrate, by injecting a hydrogen ion ($H^+$) from the surface of the silicon oxide layer.

Figure 11A:
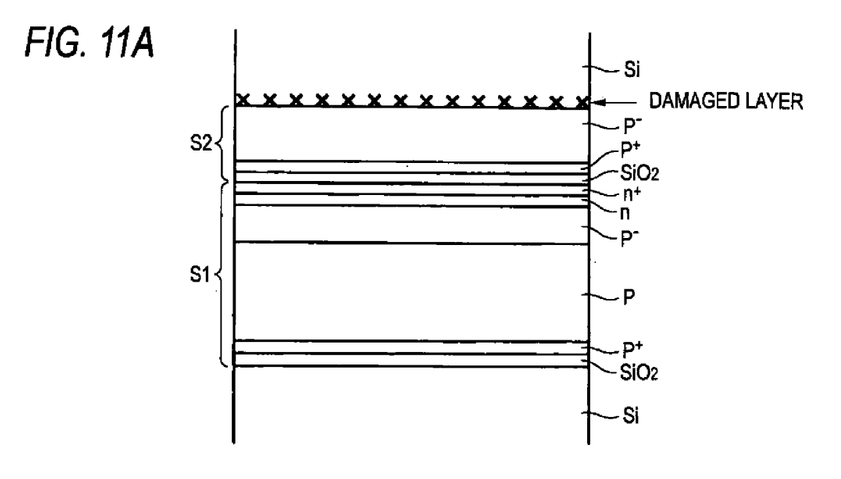
FIGS. 11A and 11B are views explaining procedures in the method of manufacturing an imaging device, wherein some of reference numerals and signs in the drawings are set forth below.
Figure 11B:
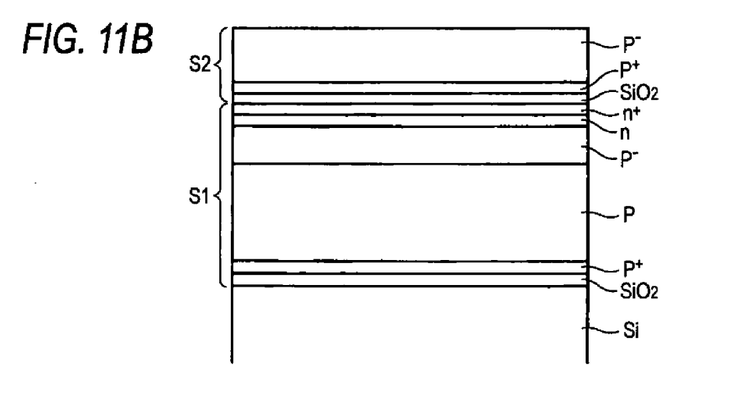

Then, as shown in FIG. 11A, a semiconductor substrate S2 is bonded to the semiconductor substrate S1 through the silicon oxide layer. Then, as shown in FIG. 11B, the silicon substrate and the epitaxial layer are separated from each other by using the damaged layer as a separation surface. In this manner, it is possible to form a semiconductor wafer in which two embedded oxide layers (silicon oxide layers $SiO_2$) are formed with a plurality of impurity layers having different impurity concentration interposed therebetween.

What is claimed is:

1. An imaging device comprising: in order,
   a photoelectric conversion layer that has a silicon crystal structure and generates signal charges upon incidence of light;
   a multiplication and accumulation layer that multiplies the signal charges by a phenomenon of avalanche electron multiplication; and
   a wiring substrate that reads the signal charges from the multiplication and accumulation layer and transmits the read signal charges,
   wherein
   the photoelectric conversion layer includes:
   a first conductive impurity layer containing first impurities in an impurity concentration;
   an electron acceleration layer containing the first impurities in a lower impurity concentration than that of the first conductive impurity layer; and
   a second conductive impurity layer to which a voltage is applied, the second conductive impurity layer containing second impurities and disposed on a side opposite a light incidence side of the electron acceleration layer, and
   an insulating layer is disposed between the electron acceleration layer and the multiplication and accumulation layer.

2. The imaging device according to claim 1, wherein the impurity concentration of the first layer gradually decreases in a direction of incident light.

3. The imaging device according to claim 1, wherein the photoelectric conversion layer includes: a low electric field region disposed at a light incidence side of the photoelectric conversion layer; and a high electric field region closer to a side of the multiplication and accumulation layer than the low electric field region, the high electric field region having an electric potential gradient larger than that of the low electric field region.

4. The imaging device according to claim 1, wherein the photoelectric conversion layer has a thickness of 5 μm or more.

5. A method of manufacturing an imaging device according to claim 1, wherein the photoelectric conversion layer and the multiplication and accumulation layer has a structure in which epitaxial layers, each including a plurality of impurity layers formed by epitaxial growth, are superposed each other, the method comprising:

sequentially forming impurity layers on a first silicon substrate by epitaxial growth as a first epitaxial layer;

forming an oxide layer on a surface of the first epitaxial layer;

injecting hydrogen ions between the first silicon substrate and an impurity layer adjacent to the first silicon substrate;

bonding the first epitaxial layer via oxide layer to a second epitaxial layer formed on a second silicon substrte; and separating the first epitaxial layer from the first silicon substrate by using a smart cutting method.

6. A method of driving an imaging device according to claim 1, comprising applying a negative voltage to the first impurity layer in high-sensitivity imaging, wherein an absolute value of the negative voltage is larger than that in normal imaging.

* * * * *